United States Patent
Tseng et al.

(10) Patent No.: US 9,307,646 B2
(45) Date of Patent: Apr. 5, 2016

(54) OVER-CURRENT PROTECTION DEVICE AND PROTECTIVE CIRCUIT BOARD CONTAINING THE SAME

(71) Applicants: Chun Teng Tseng, Sanwan Township, Miaoli County (TW); Chi Jen Su, New Taipei (TW); Wen Feng Lee, Taoyuan (TW)

(72) Inventors: Chun Teng Tseng, Sanwan Township, Miaoli County (TW); Chi Jen Su, New Taipei (TW); Wen Feng Lee, Taoyuan (TW)

(73) Assignee: POLYTRONICS TECHNOLOGY CORP., Hsinchu (TW)

( * ) Notice: Subject to any disclaimer, the term of this patent is extended or adjusted under 35 U.S.C. 154(b) by 65 days.

(21) Appl. No.: 14/509,619

(22) Filed: Oct. 8, 2014

(65) Prior Publication Data

US 2015/0146334 A1 May 28, 2015

(30) Foreign Application Priority Data

Nov. 25, 2013 (TW) .............................. 102142744 A

(51) Int. Cl.
| | |
|---|---|
| H02H 3/08 | (2006.01) |
| H02H 9/02 | (2006.01) |
| H05K 1/18 | (2006.01) |
| H01C 7/02 | (2006.01) |
| H05K 1/11 | (2006.01) |
| H05K 3/34 | (2006.01) |
| H01C 7/10 | (2006.01) |
| H01C 7/13 | (2006.01) |

(52) U.S. Cl.
CPC ................. *H05K 1/181* (2013.01); *H01C 7/02* (2013.01); *H01C 7/021* (2013.01); *H05K 1/111* (2013.01); *H05K 3/3442* (2013.01); *H05K 1/189* (2013.01); *Y02P 70/611* (2015.11); *Y02P 70/613* (2015.11)

(58) Field of Classification Search
CPC ..... H05K 1/181; H05K 1/111; H05K 3/3442; H05K 1/189; H01C 7/021; H01C 7/02; Y02P 70/613
USPC ........................................................ 361/93.1
See application file for complete search history.

(56) References Cited

U.S. PATENT DOCUMENTS

| | | | | |
|---|---|---|---|---|
| 6,713,210 | B1 * | 3/2004 | Sato | H01C 1/1406 429/61 |
| 7,180,719 | B2 * | 2/2007 | Whitney | H01C 7/021 361/103 |
| 8,482,373 | B1 * | 7/2013 | Tseng | H01C 7/13 338/20 |
| 8,502,638 | B1 * | 8/2013 | Sha | H01C 7/008 338/13 |

(Continued)

FOREIGN PATENT DOCUMENTS

| | | |
|---|---|---|
| TW | 200843592 A | 11/2008 |
| TW | I411188 B | 10/2013 |

*Primary Examiner* — Dharti Patel
(74) *Attorney, Agent, or Firm* — Egbert Law Offices, PLLC

(57) ABSTRACT

An over-current protection device adapted to be soldered onto a circuit board comprises a PTC material layer, a first electrode foil, a second electrode foil, a bonding section and a metal connecting member. The PTC material layer has opposite first and second surfaces. The first electrode foil is in physical contact with the first surface, and the second electrode foil electrically connects to the second surface. Both the second electrode foil and the bonding section are disposed on bottom of the device, and the bonding section is separated from the second electrode foil. The metal connecting member is disposed on the lateral surface of the device. The second electrode foil is adapted to be soldered onto an electrode section of the circuit board. The bonding section and the metal connecting member connect to corresponding joint section of the circuit board.

20 Claims, 8 Drawing Sheets

(56) References Cited

U.S. PATENT DOCUMENTS

| | | | |
|---|---|---|---|
| 8,842,406 B2 * | 9/2014 | Tseng | H01C 1/01 338/22 R |
| 2004/0022001 A1 * | 2/2004 | Chu | H01C 7/02 361/103 |
| 2006/0152329 A1 * | 7/2006 | Bjorsell | H01C 1/1406 338/22 R |
| 2014/0063671 A1 * | 3/2014 | Chu | H02H 3/08 361/93.8 |
| 2014/0091896 A1 * | 4/2014 | Wang | H01C 1/08 338/22 R |

* cited by examiner

OVER-CURRENT PROTECTION DEVICE AND PROTECTIVE CIRCUIT BOARD CONTAINING THE SAME

CROSS-REFERENCE TO RELATED APPLICATIONS

Not applicable.

STATEMENT REGARDING FEDERALLY SPONSORED RESEARCH OR DEVELOPMENT

Not applicable.

NAMES OF THE PARTIES TO A JOINT RESEARCH AGREEMENT

Not applicable.

INCORPORATION-BY-REFERENCE OF MATERIALS SUBMITTED ON A COMPACT DISC

Not applicable.

BACKGROUND OF THE INVENTION

1. Field of the Invention

The present application relates to an over-current protection device, and a protective circuit board on which the over-current protection device is disposed. The over-current protection device exhibits positive temperature coefficient (PTC) behavior.

2. Description of Related Art Including Information Disclosed Under 37 CFR 1.97 and 37 CFR 1.98.

The resistance of conductive composite materials having PTC characteristic is very sensitive to temperature variation. The resistance of the PTC conductive composite material remains extremely low at normal temperature, so that the circuit or cell can operate normally. However, when an over-current or an over-temperature event occurs in the circuit or cell, the resistance instantaneously increases to a high resistance state (e.g. at least $10^2 \Omega$), so as to suppress over-current and protect the cell or the circuit device.

U.S. Pat. No. 6,713,210 disclosed a circuit board with over-current protection function. As shown in FIG. 1, an IC device 2 is placed on a circuit board 1, and a PTC device 3 is surface-mounted on the circuit board 1. The PTC device 3 is a stack structure in which a PTC material layer 6 is laminated between nickel foils (or nickel-plated copper foils) 7 and 7'. The nickel foils 7 and 7' serve as electrodes for the PTC material layer 6. A nickel plate 4 serving as an external electrode is secured on the upper surface of the nickel foil 7, and an electrode 5 is soldered onto the lower surface of the nickel foil 7' that is adjacent to the surface of the circuit board 1. The nickel plate 4 and the copper plate 5 are symmetrical with reference to the PTC device 3. The electrode 5 is an electrode section within the circuit board 1, thereby reducing the height of the assembly to meet the requirement of miniaturization.

The PTC device 3 is soldered onto the circuit board 1, and the bonding strength, however, is worse than that by spot-welding. Therefore, the PTC device 3 may be peeled off from the circuit board 1 in sequential assembling process. For example, when assembling the circuit board 1, the nickel plate 4 may bend to be soldered onto the battery. The torque and tension caused by bending may damage the bonding structure between the PTC device 3 and the circuit board 1, or peel off the PTC device 3 from the circuit board 1.

In view of the foregoing, it is demanded to obtain a solution on how to improve the bonding strength between the PTC device and the circuit board to avoid the peeling of the PTC device from the circuit board.

BRIEF SUMMARY OF THE INVENTION

The present application provides an over-current protection device of PTC characteristic, which can firmly bond with a circuit board and therefore is not easily peeled off by the tension or torque from the circuit board during sequential assembly process. Moreover, the entire upper surface of the over-current protection device can be joined with an external electrode by welding or soldering; thus specific soldering or welding area for connecting to the external electrode is not needed.

In accordance with a first aspect of the present application, an over-current protection device to be soldered onto a circuit board is devised. The over-current protection device is a rectangular cuboid having an upper surface, a lower surface and four lateral surfaces connecting the upper surface and the lower surface, and comprises a PTC material layer, a first electrode foil, a second electrode foil, at least one bonding section and at least one metal connecting member. The PTC material layer has two opposite first and second surfaces. The first electrode foil is in physical contact with the first surface, whereas the second electrode foil electrically connects to the second surface of the PTC material layer. The second electrode foil and the bonding section are disposed at the lower surface of over-current protection device, and the bonding section is separated from the second electrode foil. The metal connecting member is disposed at the lateral surface. The second electrode foil is used to be soldered onto an electrode section of the circuit board. The bonding section and metal connecting member connect to corresponding joint sections of the circuit board by soldering.

In accordance with a second aspect of the present application, a protective circuit board comprising a circuit board and an over-current protection device disposed thereon is devised. The over-current protection device is a rectangular cuboid having an upper surface, a lower surface and four lateral surfaces connecting the upper surface and the lower surface, and comprises a PTC material layer, a first electrode foil, a second electrode foil, at least one bonding section and one or more metal connecting members. The PTC material layer has two opposite first and second surfaces. The first electrode foil is in physical contact with the first surface, whereas the second electrode foil electrically connects to the second surface of the PTC material layer. The second electrode foil and the bonding section are disposed at the lower surface of over-current protection device, and the bonding section is separated from the second electrode foil. The metal connecting member is disposed at the lateral surface. The circuit board has a surface provided with an electrode section and joint sections. The second electrode foil is soldered onto an electrode section of the circuit board. The bonding section and metal connecting member connect to the joint sections.

In an embodiment, the bonding section surrounds the second electrode foil, and is disposed at the periphery of the lower surface. The metal connecting member may be disposed at the four lateral surfaces, and may cover entire lateral surfaces, i.e., the so-called full surface design.

In an embodiment, bonding sections are disposed at two opposite ends of the lower surface of the over-current protection device, and the second metal electrode foil is disposed between the bonding sections at the two ends. The metal connecting members are disposed at the two lateral surfaces corresponding to the two ends.

In an embodiment, the bonding sections are disposed at corners of the lower surface. The metal connecting members are metal conductive through-holes disposed at the corner surfaces defined by every two adjacent lateral surfaces.

In an embodiment, the metal connecting member connects to the first electrode foil and the bonding section.

In an embodiment, solder wicking structure is formed between the metal connecting member and the circuit board.

In an embodiment, a welding plate may be formed on the first electrode foil for being connected to an external electrode by spot-welding.

In an embodiment, the second electrode foil is in physical contact with second surface of the PTC material layer.

In an embodiment, the over-current protection device may further comprise an insulating layer and a third electrode foil. The insulating layer is disposed on the first electrode foil, and the third electrode foil is disposed on the insulating layer and electrically connects to the first electrode foil.

In an embodiment, the over-current protection device may further comprise a third electrode foil, an insulating layer and at least one conductive member. The third electrode foil is disposed on the second surface of the PTC material layer and is separated from the metal connecting member. The insulating layer is disposed between the second and third electrode foils. The conductive connecting member goes through the insulating layer to electrically connect the second and third electrode foils.

In an embodiment, the circuit board is a flexible printed circuit (FPC) board, and the FPC board is provided with two soldering plates, and the two soldering plates may be placed at two sides of the FPC board and electrically connect to the bonding section and the second electrode foil, respectively. The FPC board may be provided with two openings under the soldering plates for welding, e.g., spot-welding, at either side of the soldering plates.

The over-current protection device and the protective circuit board containing the same is devised to enhance welding or soldering strength, and therefore is able to resolve the problem that the over-current protection device may be peeled off from the circuit board during sequential assembly process. In addition, the over-current protection device has an entire surface adapted to connect to an external electrode by spot-welding or soldering, so that accurate positioning for welding or soldering is not needed and thereby enhancing manufacturing efficiency.

BRIEF DESCRIPTION OF THE SEVERAL VIEWS OF THE DRAWINGS

The present application will be described according to the appended drawings in which.

DETAILED DESCRIPTION OF THE INVENTION

The making and using of the presently preferred illustrative embodiments are discussed in detail below. It should be appreciated, however, that the present application provides many applicable inventive concepts that can be embodied in a wide variety of specific contexts. The specific illustrative embodiments discussed are merely illustrative of specific ways to make and use the invention, and do not limit the scope of the invention.

Figure 1:
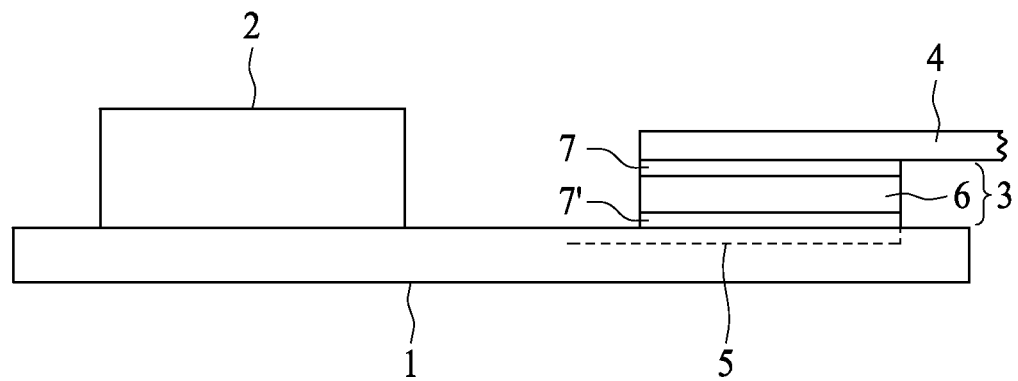
FIG. 1 shows a known over-current protection device and the protective circuit board containing the same.
Figure 2A:
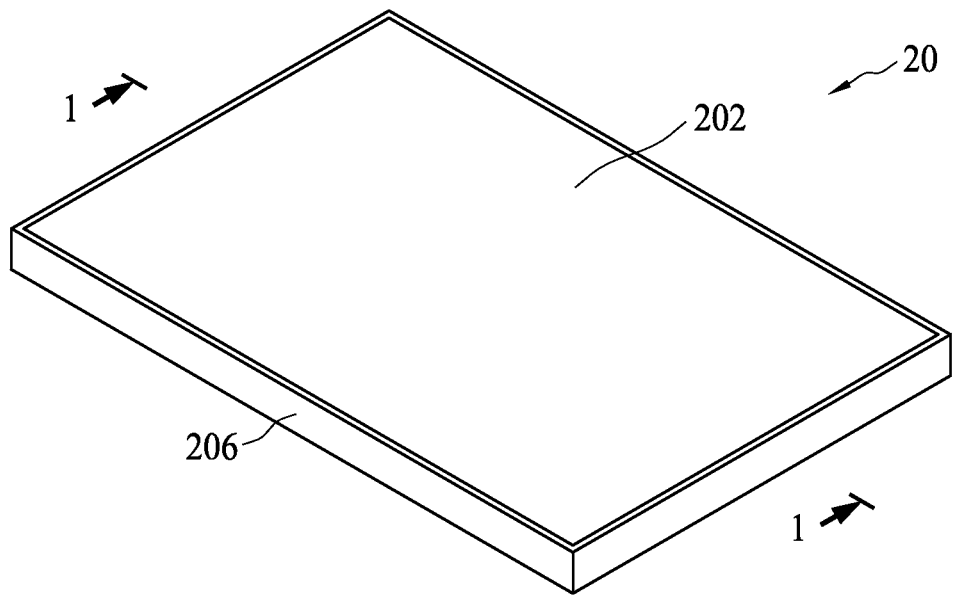
FIGS. 2A to 2C show an over-current protection device in accordance with an embodiment of the present application.
Figure 2B:
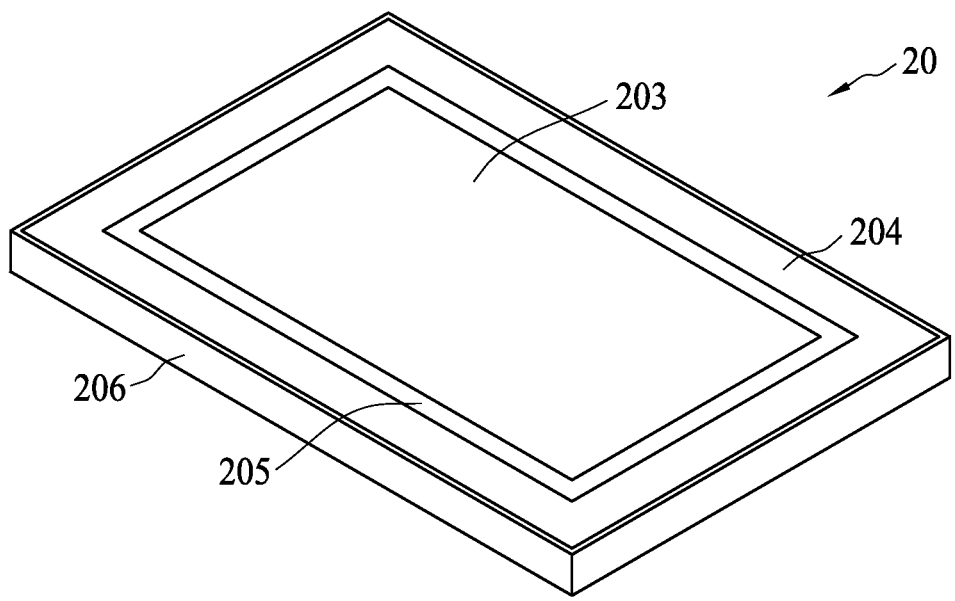
Figure 2C:
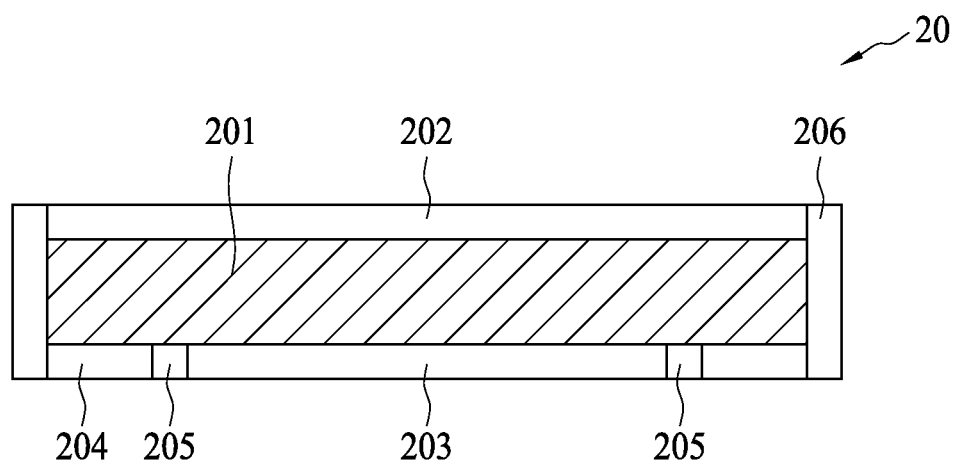

FIGS. 2A to 2C show an over-current protection device in accordance with a first embodiment of the present application. FIG. 2A shows a perspective view of an over-current protection device 20. FIG. 2B show the over-current protection device 20 which is turned upside down. FIG. 2C shows a cross-sectional view along line 1-1 in FIG. 2A. The over-current protection device 20 is a rectangular cuboid having an upper surface, a lower surface and four lateral surfaces connecting the upper and lower surfaces. The over-current protection device 20 comprises a PTC material layer 201, a first electrode foil 202 and a second electrode foil 203. The PTC material layer 201 is laminated between the first electrode foil 202 and the second electrode foil 203. More specifically, the first electrode foil 202 is in physical contact with the upper surface of the PTC material layer 201, and the second electrode foil 203 is in physical contact with the lower surface of the PTC material layer 201. The second electrode foil 203 is disposed at the center of the lower surface of the PTC material layer 201. The bonding section 204 surrounds the second electrode foil 203, i.e., the bonding section 204 is disposed at the periphery of the lower surface of the PTC material layer 201. The second electrode foil 203 and the bonding section 204 form the lower surface of the over-current protection device 20, and an insulating isolation 205 is disposed therebetween to separate the second electrode foil 203 from the bonding section 204. The insulating isolation 205 may comprise solder mask. The four lateral surfaces of the over-current protection device 20 may be plated with metal layers, such as metal-plated full surfaces, to form a metal connecting member 206 connecting the first electrode foil 202 and the bonding section 204.

Figure 3A:
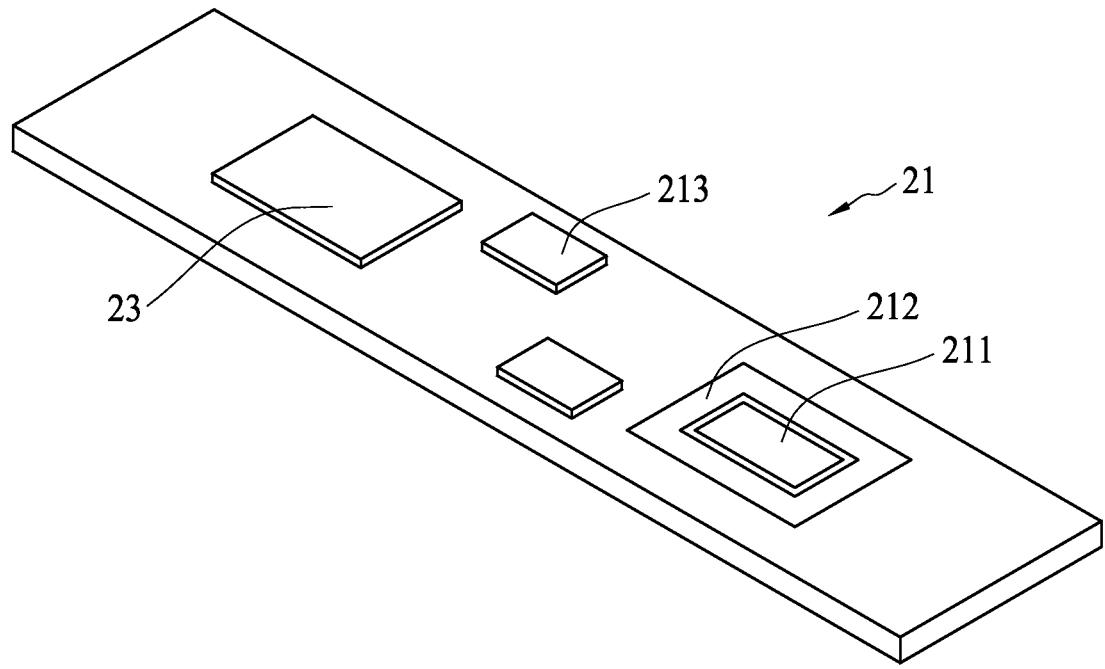
FIG. 3A shows a circuit board adapted to carry an over-current protection device in accordance with an embodiment of the present application.
Figure 3B:
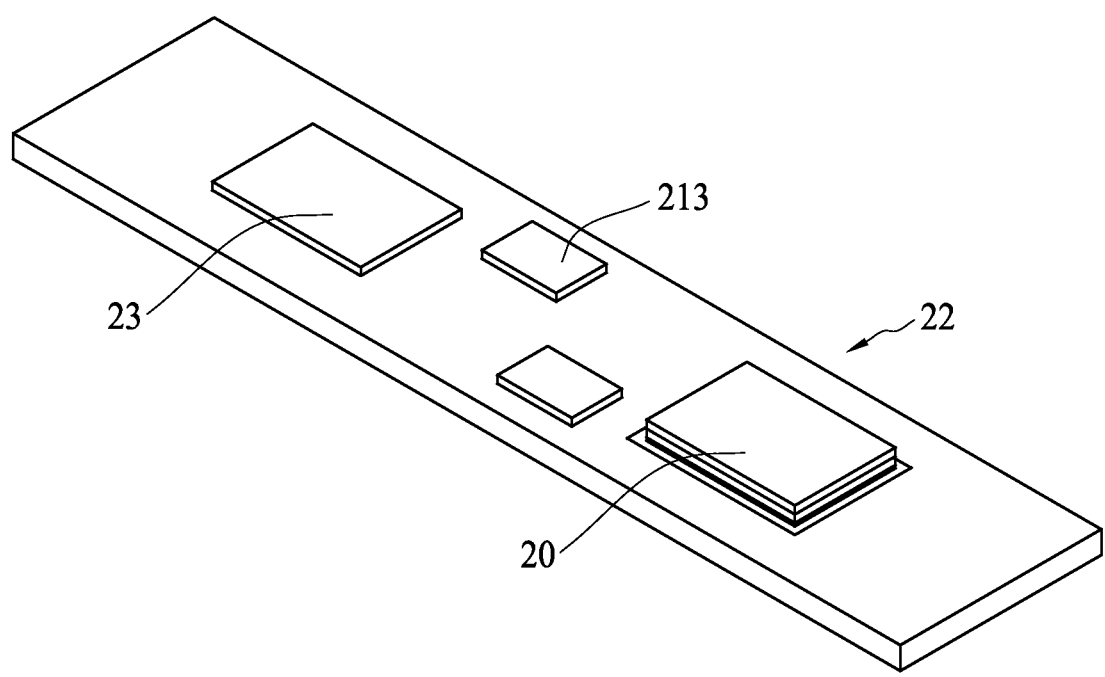
FIGS. 3B to 3D show a protective circuit board in accordance with an embodiment of the present application.
Figure 3C:
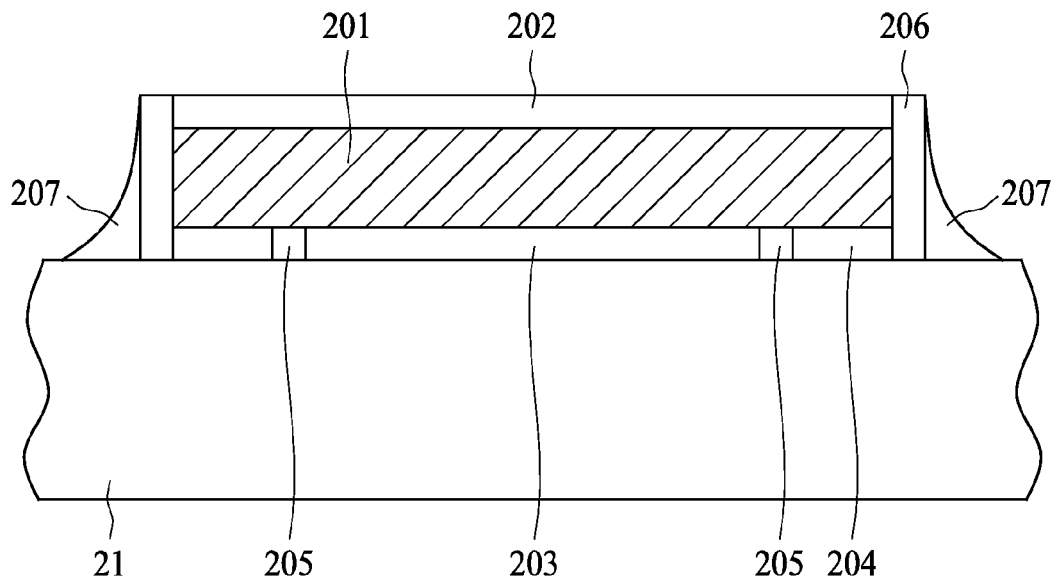

FIG. 3A shows a circuit board 21 of which a surface may engage with an over-current protection device by soldering to form a protective circuit board 22 or the so-called protective circuit module (PCM), as shown in FIG. 3B. The second electrode foil 203 of the over-current protection device 20 is soldered onto the electrode section 211 of the circuit board 21, and the circuit board 21 is provided with a rectangular-loop joint section 212 adapted to bond to the bonding section 204. The electrode section 211 is separated from the joint section 212. Moreover, the circuit board 21 is provided with a welding plate 23 for bonding to an external electrode (not shown), so as to connect the external electrode and the related circuit of the circuit board 21. The circuit board 21 may be provided with electronic devices 213 such as ICs, resistors, capacitors or inductors. When joining the bonding section 204 and the joint section 212 by surface-mount technology or reflow soldering, the metal connecting member 206 on the lateral surfaces of the over-current protection device 20 will heat up due to the heat conduction from the bonding section 204. As a result, solder paste may wick up to form solder wicking structures 207 as shown in FIG. 3C, thereby increasing the bonding strength between the over-current protection device 20 and the circuit board 21. Accordingly, the over-current protection device 20 is not easily peeled off by tension or torque in the sequential assembly process.

An external electrode (not shown) may connect to the first electrode foil 202 of the over-current protection device 20, and associates with another external electrode connecting to the welding plate 23 to form a conductive circuit loop. The external electrodes may be of various shapes such as a straight, crooked or L-shaped stripe, and may be a nickel plate or a nickel alloy plate. The thickness of the external electrode may be 0.1 to 1 mm, or 0.3 mm, 0.5 mm, in particular.

Figure 3D:
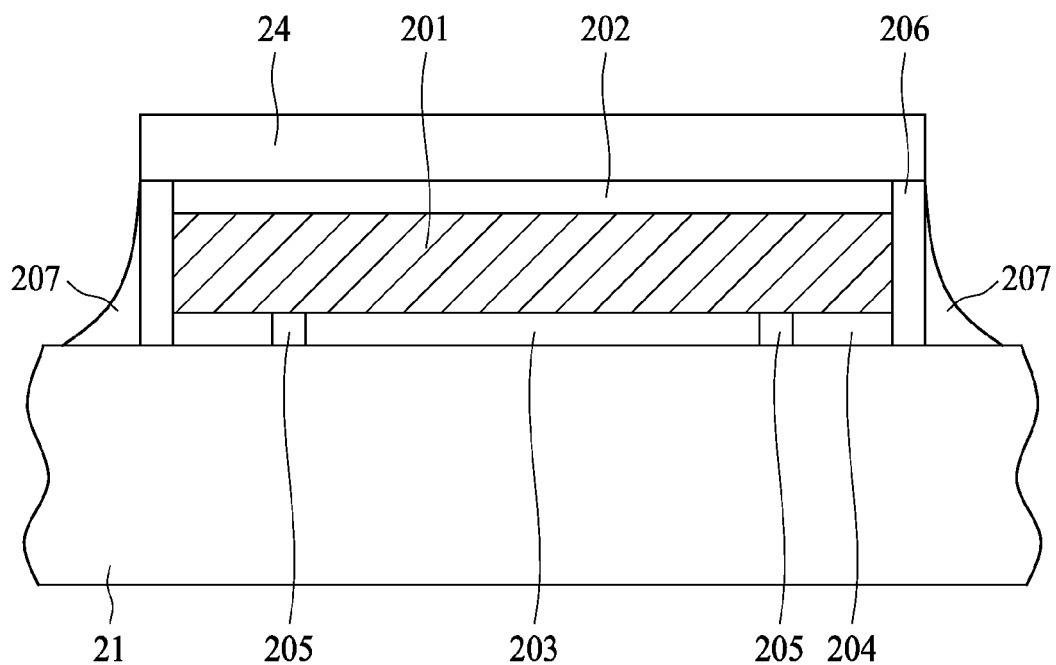

In an embodiment, the first electrode foil 202 may join a welding plate 24, as shown in FIG. 3D, for being spot-welded an external electrode. To prevent the PTC material layer 20 from being damaged by heat, the welding plate 24 has to have a certain heat mass and its thickness is equal to or greater than 0.1 mm, 0.2 mm, or preferably 0.3 mm. The welding plates 23 and 24 capable of connecting to two external electrodes to form a conductive loop in series connection with the over-current protection device 20.

The PTC material layer 201 comprises crystalline polymer and conductive filler. The crystalline polymer comprises polyethylene, polypropylene, polyvinyl fluoride, mixture or copolymer thereof. The conductive filler may comprise metal filler, carbon-containing filler, metal oxide filler, metal carbide filler, or mixture, solid solution, or core-shell thereof. For example, the conductive filler may comprise titanium carbide (TiC), tungsten carbide (WC), vanadium carbide (VC), zirconium carbide (ZrC), niobium carbide (NbC), tantalum carbide (TaC), molybdenum carbide (MoC), hafnium carbide (HfC), titanium boride ($TiB_2$), vanadium boride ($VB_2$), zirconium boride (ZrB2), niobium boride (NbB2), molybdenum boride ($MoB_2$), hafnium boride ($HfB_2$), titanium nitride (TiN) or zirconium nitride (ZrN).

The insulating isolation 205 between the second electrode foil 203 and the bonding section 204 may be formed from a planar metal foil by laser-trimming, chemical etching, mechanical machining. The first electrode foil 202, the second electrode foil 203 and the bonding section 204 may comprise nickel, copper, zinc, silver, gold, alloy or a multi-layer structure thereof, such as nickel-plated copper foil and tin-plated copper foil.

Figure 4A:
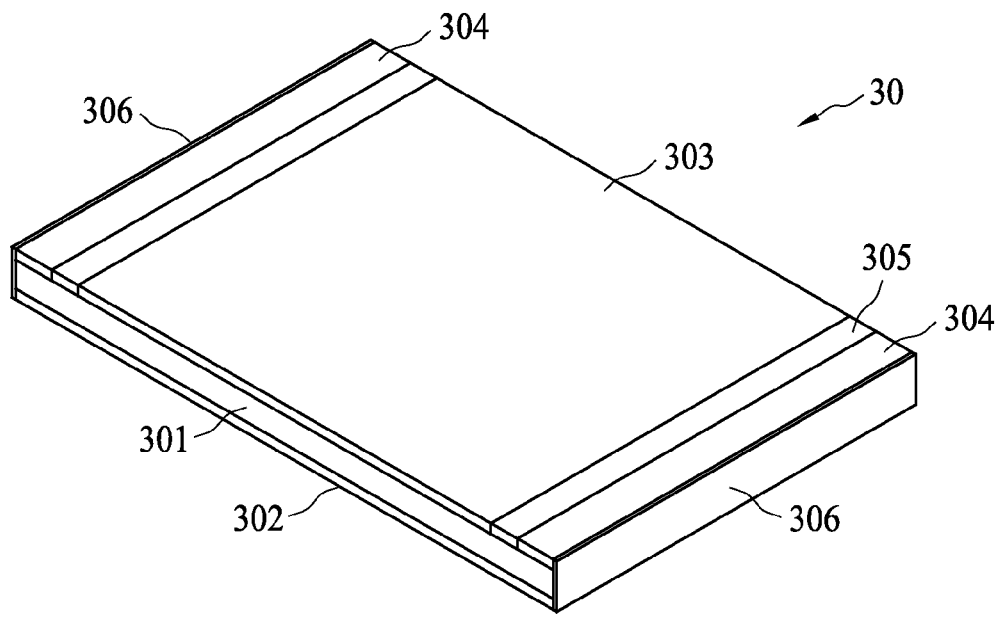
FIGS. 4A and 4B show an over-current protection device and a corresponding protective circuit board in accordance with an embodiment of the present application.
Figure 4B:
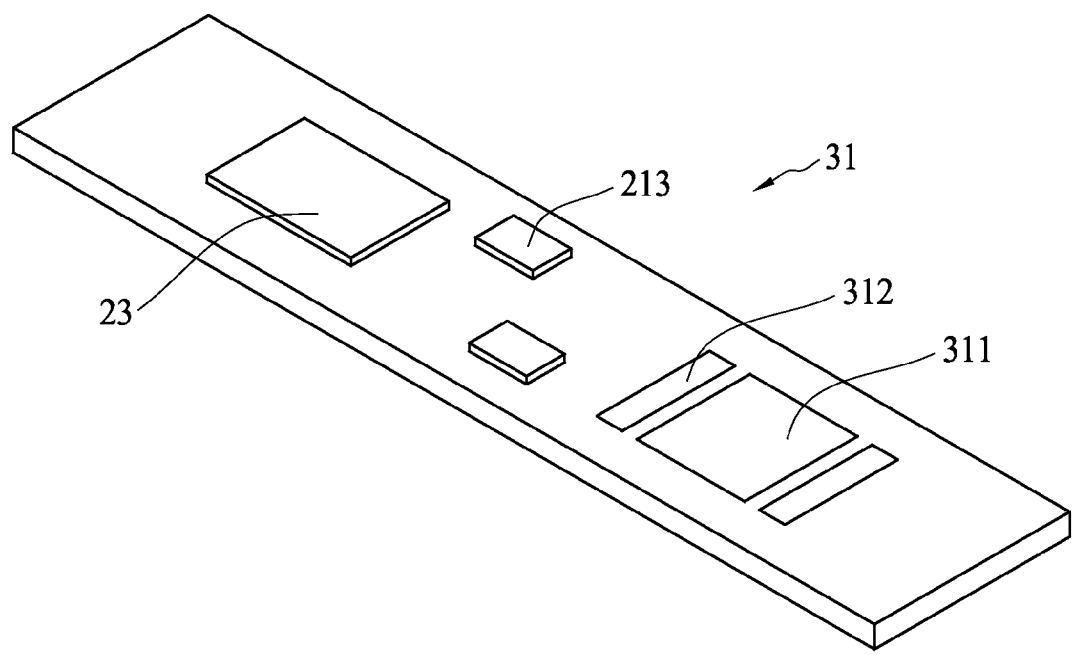

FIG. 4A shows an over-current protection device 30, which is turned upside down, in accordance with a second embodiment of the present application. FIG. 4B shows a circuit board 31 corresponding to the over-current protection device 30 which is configured to be soldered onto the circuit board 31. Similar to the first embodiment, the over-current protection device 30 comprises a PTC material layer 301, a first electrode foil 302 and a second electrode foil 303. The second electrode foil 303 is disposed at the center of the lower surface of the over-current protection device 30. Bonding sections 304 are placed at the two ends of the lower surface, and are separated from the second electrode foil 303 by insulating isolations 305. Metal connecting members 306 are formed at the lateral surfaces corresponding to the bonding sections 304, and connect to the first electrode foil 302 and the bonding sections 304. FIG. 4B shows the circuit board 31 adapted to assemble the over-current protection device 30. The second electrode foil 303 of the over-current protection device 30 is configured to bond to an electrode section 311 of the circuit board 31 by soldering, and the circuit board 31 is provided with joint sections 312 corresponding to the bonding sections 304 of the over-current protection device 30 for soldering. The joint sections 312 are separated from the electrode section 311. When the over-current protection device 30 is soldered onto the circuit board 31, the metal connecting member 306 on the lateral surfaces of the over-current protection device 30 will heat up due to the heat conduction from the bonding section 304. As a result, solder paste may wick up to form solder wicking structures, thereby increasing the bonding strength between the over-current protection device 30 and the circuit board 31. Like that shown in FIG. 3D, a welding plate may be formed on the first electrode foil 302 for joining an external electrode by spot-welding directly.

Figure 5A:
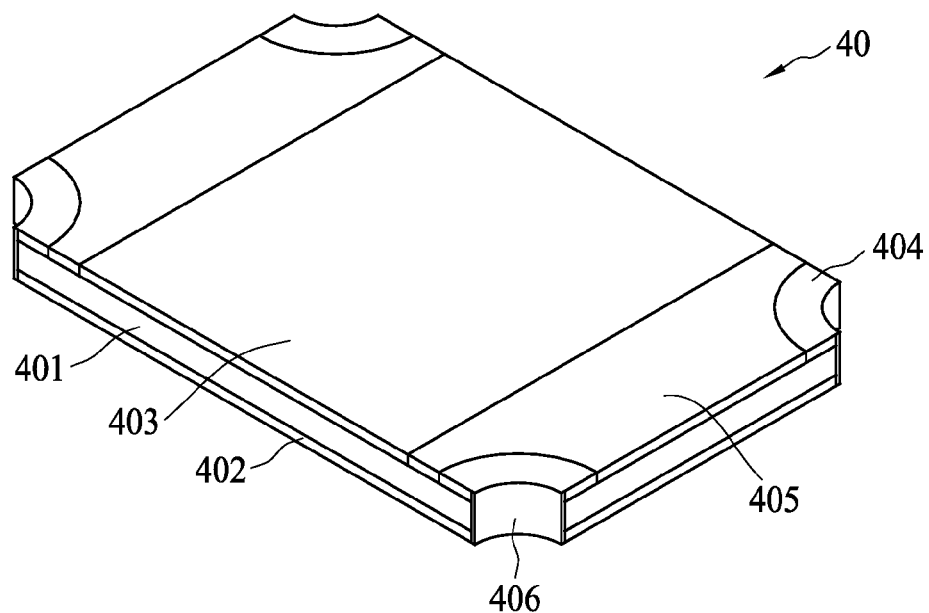
FIGS. 5A and 5B show an over-current protection device and a corresponding protective circuit board in accordance with another embodiment of the present application.
Figure 5B:
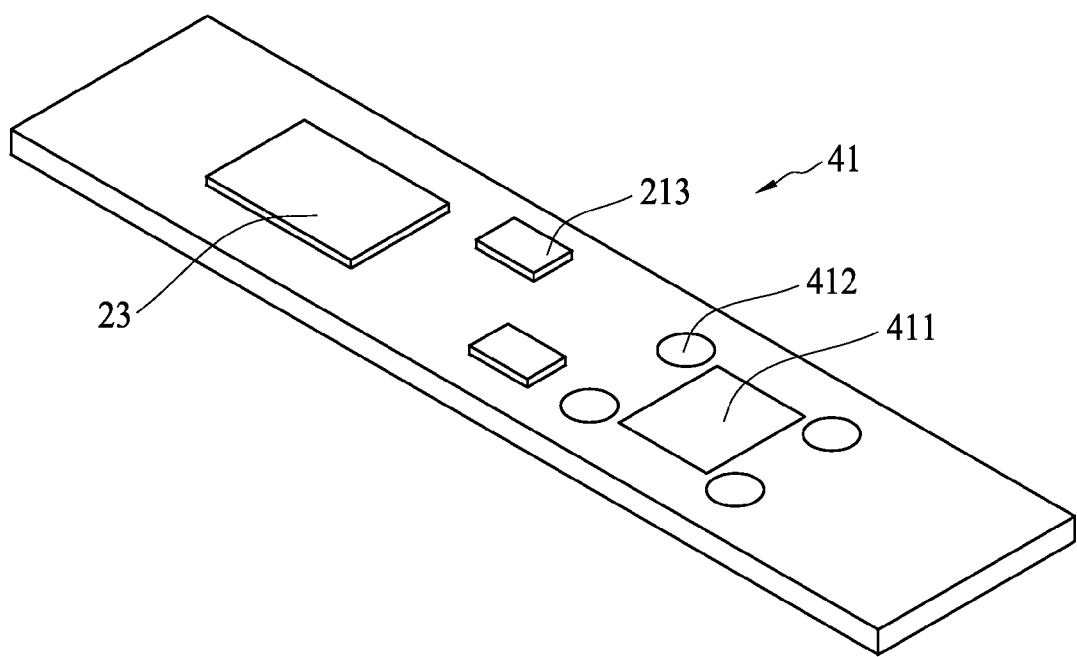

FIG. 5A shows an over-current protection device 40, which is turned upside down, in accordance with a third embodiment of the present application. FIG. 5B shows a circuit board 41 corresponding to the over-current protection device 40 which is configured to be soldered onto the circuit board 41. Similar to the first embodiment, the over-current protection device 40 comprises a PTC material layer 401, a first electrode foil 402 and a second electrode foil 403. The second electrode foil 403 is disposed at the center of the lower surface of the over-current protection device 40. Bonding sections 404 are placed at four corners of the lower surface, and are separated from the second electrode foil 403 by insulating isolations 405. Metal connecting members 406, which extend vertically, are formed on the corner surfaces each defined by every two adjacent lateral surfaces corresponding to each of the bonding sections 404. The metal connecting members 406 may be metal conductive quarterly-circular through-holes connecting to the first electrode foil 402 and the bonding sections 404. FIG. 5B shows the circuit board 41 adapted to assemble the over-current protection device 40. The second electrode foil 403 of the over-current protection device 40 is configured to bond to an electrode section 411 of the circuit board 41 by soldering, and the circuit board 41 is provided with joint sections 412 corresponding to the bonding sections 404 of the over-current protection device 40 for soldering. The joint sections 412 are separated from the electrode section 411. When the over-current protection device 40 is soldered onto the circuit board 41, the metal connecting member 406 will heat up due to heat conduction from the bonding section 404. As a result, solder paste may wick up to form solder wicking structures between the metal connecting members 406 and the circuit board 41, thereby increasing the bonding strength therebetween. Like that shown in FIG. 3D, a welding plate may be formed on the first electrode foil 402 for joining an external electrode by spot-welding directly.

The above-mentioned first to third embodiments, the bonding sections 204, 304 and 404 merely physically bond to the joint sections 212, 312 and 412, and there is no electrical current flowing therethrough. The first electrode foil 202, 302 and 402 are full surfaces without patterns; therefore external electrodes or welding plates can be easily and directly bonded thereto. Accordingly, it is beneficial to the ease of use.

Figure 6A:
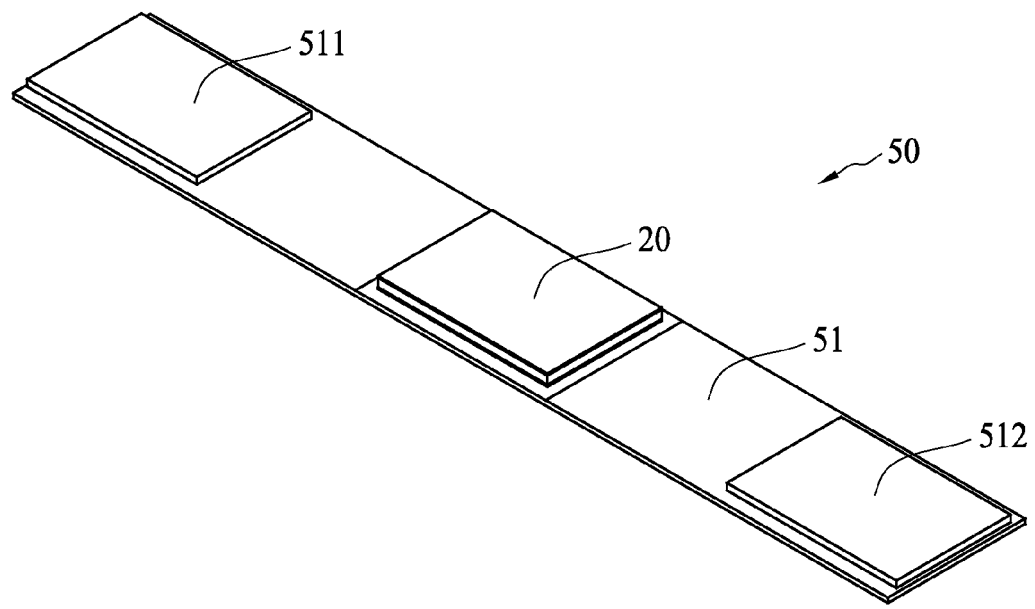
FIGS. 6A and 6B show a circuit board in accordance with another embodiment of the present application.

In addition to traditional fiber-reinforced glass board, e.g., FR-4, a flexible printed circuit (FPC) board can be used to carry the over-current protection device also. As shown in FIG. 6A, the over-current protection device 20 of the first embodiment is exemplified to be soldered onto a FPC board 51 to form a protective circuit board 50. The FPC board 51 may be provided with two welding plates 511 and 512 that serve as external electrodes at the two ends. In this embodiment, the second electrode foil 203 and bonding section 204 serve as two electrodes of the over-current protection device 20, and electrically connect to the welding plate 511 and 512, respectively. More specifically, the welding plates 511 and 512 are in series connection with the over-current protection device 20 disposed therebetween. In contrast to the embodiments mentioned above, the bonding section 204 is able to transmit current. The FPC board 51 is bendable, and therefore it may be bent to "L" shape for the ease of soldering onto a secondary battery.

By associating with the FPC which provides better heat dissipation efficiency, the over-current protection device can obtain larger hold current value. The FPC is capable of being bent, thereby significantly increasing the flexibility of assembly. The electrical connections between the second electrode foil 203 and the welding plate 511 and between the bonding section 204 and welding plate 512 can be conductive copper line made by printed circuit process, so as to simplify process and reduce manufacturing cost.

Figure 6B:
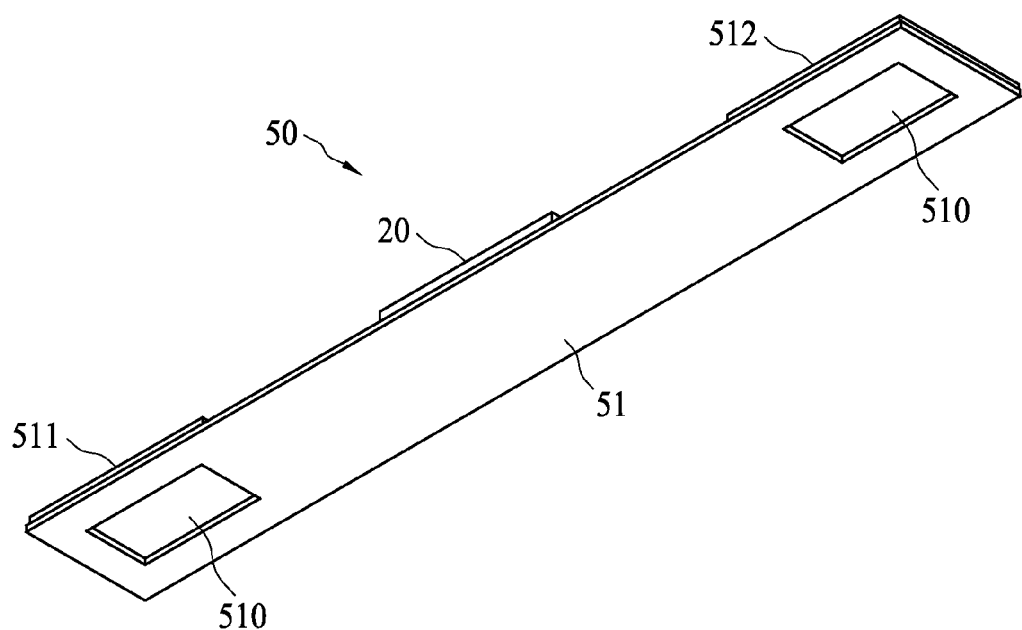

FIG. 6B shows the bottom view of the protective circuit board 50. The FPC board 51 may be provided with two openings 510 under the welding plates 511 and 512. As a result, either the upper or lower side of the welding plates 511 and 512 can serve as an interface for spot-welding connection to external electrodes, so as to increase the flexibility of assembly.

Figure 7A:
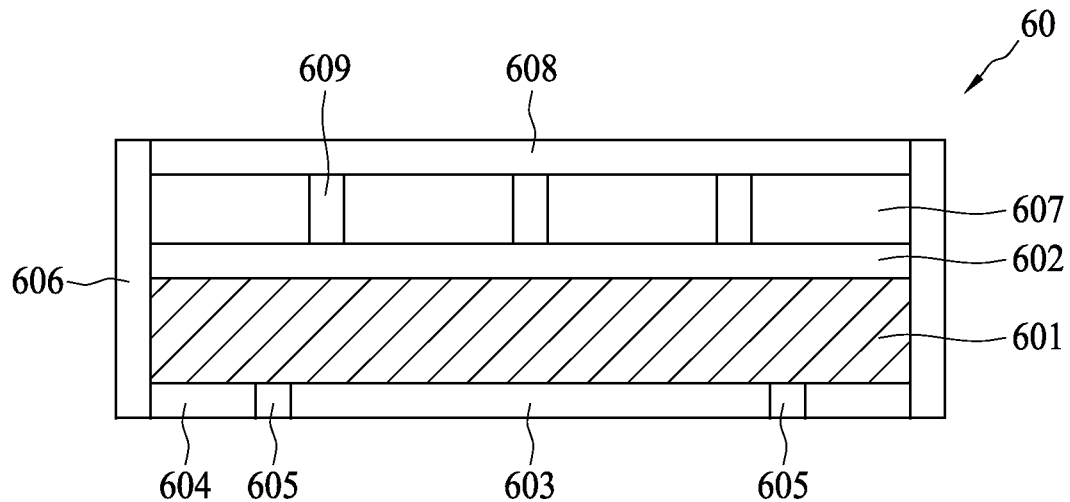
FIGS. 7A and 7B show over-current protection devices in accordance with other embodiments of the present application.

FIG. 7A shows an over-current protection device 60 in accordance with another embodiment of the present application. The over-current protection device 60 comprises a PTC material layer 601, a first electrode foil 602, a second electrode foil 603, a bonding section 604, an insulating layer 607, a third electrode foil 608, and metal connecting members 606. The PTC material layer 601 is laminated between the first electrode foil 602 and the second electrode foil 603. More specifically, the first electrode foil 602 is in physical contact with the upper surface of the PTC material layer 601, and the second electrode foil 602 is in physical contact with the lower surface of the PTC material layer 601. The insulating layer 607 is disposed on the first electrode foil 602, and may be made of prepreg. The third electrode foil 608 is disposed on the insulating layer 607 and electrically connects to the first electrode foil 602. The bonding section 604 and the second electrode foil 603 are disposed at the lower surface of the over-current protection device 60, and insulating isolation 605 separates the bonding section 604 from the second electrode foil 603. The metal connecting members 606 are formed at lateral surfaces of the device 60 and connect to bonding section 604, a first electrode foil 602 and a third electrode foil 608. Preferably, one or more conductive members 609 connect the first electrode foil 602 and the third electrode foil 608 to speed up heat dissipation of the PTC material layer 601, so as to increase the hold current of the over-current protection device 60. Because the insulating layer 607 is further added, the third electrode foil 608 can be subjected to spot-welding directly without damage to the PTC material layer 601.

Figure 7B:
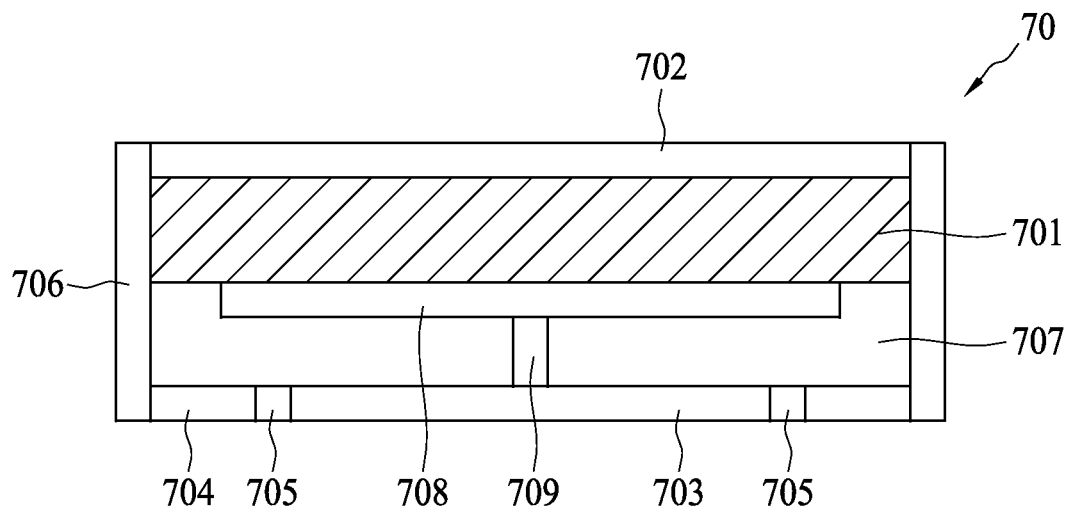

FIG. 7B shows an over-current protection device 70 in accordance with yet another embodiment of the present application. The over-current protection device 70 comprises a PTC material layer 701, a first electrode foil 702, a second electrode foil 703, a bonding section 704, an insulating layer 707, a third electrode foil 708, and metal connecting members 706. The PTC material layer 701 is laminated between the first electrode foil 702 and the third electrode foil 708. More specifically, the first electrode foil 702 is in physical contact with the upper surface of the PTC material layer 701, and the third electrode foil 708 is in physical contact with the lower surface of the PTC material layer 701. The bonding section 704 and the second electrode foil 703 are disposed at the lower surface of the over-current protection device 70, and insulating isolation 705 is formed therebetween for isolation. The insulating layer 707 is disposed between the third electrode foil 708 and the second electrode foil 703, and may be made of prepreg. The second electrode foil 703 is disposed on the insulating layer 707 and electrically connects to the third electrode foil 708. The metal connecting members 706 are formed at lateral surfaces of the device 70 and connect to bonding section 704 and the first electrode foil 702. Preferably, one or more conductive members 709 connect the second electrode foil 703 and the third electrode foil 708 for electrical conduction.

In accordance with the present application, soldering wicking would occur between the lateral surface of the over-current protection device and the circuit board to enhance the bonding strength therebetween, thereby preventing the over-current protection device from being peeled off from the circuit board by tension or torque in the sequential process. Moreover, the upper electrode foil of the over-current protection preferably is of a full-surface design without pattern for the ease of connection to an external electrode.

The above-described embodiments of the present invention are intended to be illustrative only. Numerous alternative embodiments may be devised by persons skilled in the art without departing from the scope of the following claims.

We claim:

1. An over-current protection device adapted to be soldered onto a circuit board and being a rectangular cuboid of an upper surface, a lower surface and four lateral surfaces connecting the upper and lower surfaces, comprising:
   a PTC material layer having opposite first and second surfaces;
   a first electrode foil in physical contact with the first surface of the PTC material layer;
   a second electrode foil disposed at a lower surface of the over-current protection device and electrically connecting to the second surface of the PTC material layer;
   at least one bonding section disposed at a lower surface of the over-current protection device and being separated from the second electrode foil; and
   at least one metal connecting member disposed on at least one of the lateral surfaces;
   wherein the second electrode foil is adapted to be soldered onto an electrode section of the circuit board, and the bonding section and metal connecting member connect to at least one joint section of the circuit board by soldering.

2. The over-current protection device of claim 1, wherein the bonding section surrounds the second electrode foil, and is disposed at a periphery of the lower surface.

3. The over-current protection device of claim 2, wherein the metal connecting members are disposed on all of the four lateral surfaces.

4. The over-current protection device of claim 1, wherein two bonding sections are disposed at two opposite ends of the lower surface, and the second electrode foil is disposed between the two bonding sections.

5. The over-current protection device of claim 4, wherein the metal connecting members are disposed at two of the four lateral surfaces corresponding to the metal connecting members.

6. The over-current protection device of claim 1, wherein the bonding sections are disposed at corners of the lower surface.

7. The over-current protection device of claim 6, wherein the metal connecting members are disposed at corner surfaces defined by every two adjacent lateral surfaces.

8. The over-current protection device of claim 1, wherein the metal connecting member connects the first electrode foil and the bonding section.

9. The over-current protection device of claim 1, wherein the second electrode foil is in physical contact with the second surface of the PTC material layer.

10. The over-current protection device of claim 1, wherein a welding plate is formed on the first electrode foil for connecting to an external electrode by spot-welding.

11. The over-current protection device of claim 1, further comprising:
    an insulating layer disposed on the first electrode foil; and
    a third electrode foil disposed on the insulating layer and electrically connecting to the first electrode foil.

12. The over-current protection device of claim 1, further comprising:
    a third electrode foil disposed on the second surface of the PTC material layer and being separated from the metal connecting member;
    an insulating layer disposed between the second and third electrode foils; and
    a conductive member penetrating through the insulating layer to electrically connect to the second and third electrode foils.

13. A protective circuit board, comprising:
    an over-current protection device being a rectangular cuboid of an upper surface, a lower surface and four lateral surfaces connecting the upper and lower surfaces, comprising:
        a PTC material layer having opposite first and second surfaces;
        a first electrode foil in physical contact with the first surface of the PTC material layer;
        a second electrode foil disposed at a lower surface of the over-current protection device;
        at least one bonding section disposed at the lower surface of the over-current protection device and being separated from the second electrode foil; and
        at least one metal connecting member disposed on at least one of the lateral surfaces; and
    a circuit board having a surface provided with an electrode section and at least one joint section;
    wherein the second electrode foil is soldered onto the electrode section of the circuit board, and the bonding section and metal connecting member connect to the joint section by soldering.

14. The protective circuit board of claim 13, wherein the bonding section surrounds the second electrode foil, and is disposed at a periphery of the lower surface.

15. The protective circuit board of claim 13, wherein two bonding sections are disposed at two opposite ends of the lower surface, and the second metal electrode foil is disposed between the two bonding sections.

16. The protective circuit board of claim 13, wherein the bonding sections are disposed at corners of the lower surface, and the metal connecting members are disposed at corner surfaces defined by every two adjacent lateral surfaces.

17. The protective circuit board of claim 13, wherein soldering wicking structure is formed between the metal connecting member and the circuit board.

18. The protective circuit board of claim 13, wherein the circuit board is a FPC board.

19. The protective circuit board of claim 18, wherein the PFC board is provided with two welding plates electrically connecting to the bonding section and the second electrode foil, respectively.

20. The protective circuit board of claim 19, wherein the FPC board is provided with two openings corresponding to two welding plates for welding connection to external electrodes at either side.

* * * * *